US 9,847,482 B2

United States Patent
Cho (10) Patent No.: US 9,847,482 B2
(45) Date of Patent: Dec. 19, 2017

(54) RESISTIVE MEMORY DEVICES WITH AN OXYGEN-SUPPLYING LAYER

(71) Applicant: Hewlett Packard Enterprise Development LP, Houston, TX (US)

(72) Inventor: Hans S. Cho, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/305,599

(22) PCT Filed: Apr. 29, 2014

(86) PCT No.: PCT/US2014/035911
§ 371 (c)(1),
(2) Date: Oct. 20, 2016

(87) PCT Pub. No.: WO2015/167468
PCT Pub. Date: Nov. 5, 2015

(65) Prior Publication Data
US 2017/0047516 A1 Feb. 16, 2017

(51) Int. Cl.
*H01L 47/00* (2006.01)
*H01L 45/00* (2006.01)

(52) U.S. Cl.
CPC .......... *H01L 45/1683* (2013.01); *H01L 45/08* (2013.01); *H01L 45/1233* (2013.01);
(Continued)

(58) Field of Classification Search
CPC . H01L 27/2418; H01L 27/2481; H01L 45/04; H01L 45/06; H01L 45/08;
(Continued)

(56) References Cited

U.S. PATENT DOCUMENTS 8,537,592 B2 9/2013 Liu
8,581,224 B2 11/2013 Sandhu et al.
(Continued)

FOREIGN PATENT DOCUMENTS

JP 2013089789 A 5/2013
JP 5340508 B1 8/2013
(Continued)

OTHER PUBLICATIONS

International Searching Authority, The International Search Report and the Written Opinion, Jan. 19, 2015, 13 Pages.
(Continued)

*Primary Examiner* — Brook Kebede
(74) *Attorney, Agent, or Firm* — Dierker & Associates, P.C.

(57) ABSTRACT

A resistive memory device includes a bottom electrode and a top electrode crossing the bottom electrode at a non-zero angle. A switching region operatively contacts the bottom electrode and the top electrode. The switching region defines a current path between the bottom electrode and the top electrode in an ON state. An oxygen-supplying layer operatively contacts a portion of the switching region. The oxygen-supplying layer is positioned orthogonally to the current path and to the switching region.

15 Claims, 5 Drawing Sheets (52) U.S. Cl.
CPC ........ *H01L 45/1266* (2013.01); *H01L 45/146* (2013.01); *H01L 45/1633* (2013.01); *H01L 45/1658* (2013.01); *H01L 45/1675* (2013.01)

(58) Field of Classification Search
CPC ............... H01L 45/146; H01L 45/1233; H01L 45/1266; H01L 45/1633; H01L 45/1658; H01L 45/1675
USPC ........................................................ 257/2–4
See application file for complete search history.

(56) References Cited

U.S. PATENT DOCUMENTS

| | | | | |
|---|---|---|---|---|
| 2009/0250681 | A1* | 10/2009 | Smythe | H01L 45/04 257/4 |
| 2010/0314602 | A1 | 12/2010 | Takano et al. | |
| 2011/0074539 | A1 | 3/2011 | Tsuji | |
| 2012/0068137 | A1* | 3/2012 | Hwang | H01L 27/2418 257/2 |
| 2013/0175497 | A1 | 7/2013 | Yang et al. | |

FOREIGN PATENT DOCUMENTS

| | | |
|---|---|---|
| WO | WO-2012177265 A1 | 12/2012 |
| WO | WO-2013012423 A1 | 1/2013 |
| WO | WO-2013073993 A2 | 5/2013 |

OTHER PUBLICATIONS

Strachan, J. P. et al., Characterization of Electroforming-free Titanium Dioxide Memristors, Aug. 7, 2013, 6 pages, < http://www.beilstein-journals.org/bjnano/single/articleFullText.htm?publicId=2190-4286-4-55 >.

* cited by examiner

RESISTIVE MEMORY DEVICES WITH AN OXYGEN-SUPPLYING LAYER

BACKGROUND

Resistive memory elements are programmable to different resistive states by the application of programming energy (e.g., a voltage or current pulse). After a resistive memory element is programmed, the state of the element is readable and remains stable over a specified time period. Resistive memory elements may be configured into large arrays to form resistive memory devices. Resistive memory devices may be used in a variety of applications, such as non-volatile solid state memory, programmable logic, signal processing, control systems, pattern recognition devices, etc. Some examples of resistive memory devices include memristors, phase change memory, and spin-transfer torque. In particular, a single memristor is a passive two-terminal element that maintains a functional relationship between the time integral of current (i.e., charge) and the time integral of voltage. The resistance of the memristor depends on the material, thickness, and the state the device. The resistance of each state also depends on the magnitude and polarity of the voltage applied thereto, and on the length of time that voltage has been applied.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Two-terminal memristors and other resistive memory devices may be fabricated with two electrodes and a switching material between the two electrodes. The switching material may include an oxygen-rich layer and an oxygen vacancy/ion source that are stacked between the two electrodes, such that the layers are parallel to one another and to the electrodes. In these devices, current flows in a direction normal to the stacked layers. Electrical switching arises from the coupled motion of electrons and an ionic species (e.g., oxygen vacancies or ions) within the switching material between the two electrodes. More particularly, the ionic species are caused to drift within the switching material to create localized changes in conductivity via modulation of a conductive filament and/or tunnel barrier between two electrodes, which results in a low resistance "ON" state, a high resistance "OFF" state, or intermediate states.

When the previously described devices are formed on the nano-scale (e.g., layer thicknesses ranging from about 1 nm to about 100 nm), it has been found that over time and after repeated switching events, the oxygen in the oxygen-rich layer and the drifting ionic species may intermix within the switching region. Intermixing may cause the oxygen and the ionic species to dilute one other or annihilate one other, which may result in a depletion of both the oxygen and the ionic species. This can lead to degradation of the electrical switching and a reduction in device endurance.

In the examples disclosed herein, an oxygen-supplying layer (i.e., oxygen-rich layer, oxygen reservoir, etc.) is included in addition to the switching region. This oxygen-supplying layer is desirably positioned so that it is orthogonal to the switching region and to the current path through the switching region. By "orthogonal", it is meant that a surface of the oxygen-supplying layer is substantially perpendicular to i) a surface (e.g., side walls) of the switching region and to ii) a direction of the current path (i.e., conduction path). By "substantially perpendicular," it is meant that the oxygen-supplying layer is fabricated in a distinct orientation in terms of deposition and patterning geometry, such that an angle between a surface plane of the oxygen-supplying layer and the conduction path are perpendicular or very nearly so (i.e., within ±1° to 30° variance). The orthogonally positioned oxygen-supplying layer provides a sufficient volume of oxygen that is not positioned directly within the current path, but is operatively in contact with and in the vicinity of the switching region. The oxygen is capable of migrating, drifting, etc. from the oxygen reservoir to the switching region and back in response to respective, suitable voltages. As such, the oxygen-supplying layer supplements the oxygen present in an oxygen-rich layer of the switching region. The oxygen-supplying layer is believed to enhance the switching effect as well as prolong the lifespan of the device.

Figure 1A:
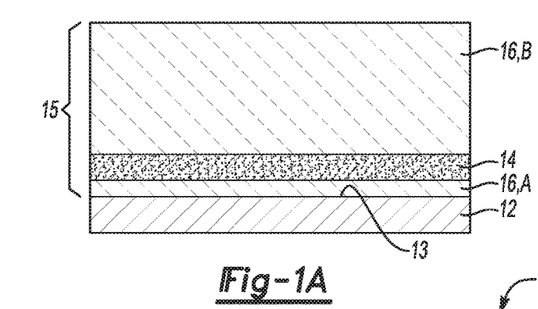
FIGS. 1A through 1D are cross-sectional views depicting an example of a method for making an example of a resistive memory device.

Referring now to FIGS. 1A through 1D, an example of a method for making an example of a resistive memory device 10 (see FIG. 1D) is schematically depicted. As shown in FIG. 1A, at the outset of this method, an oxygen-supplying layer 14 sandwiched between an insulating layer 16 is formed on a bottom electrode 12.

The bottom electrode 12 may be formed of any suitable conductive material (e.g., gold (Au), platinum (Pt), tungsten (W), aluminum (Al), copper (Cu), titanium (Ti), tantalum (Ta), titanium nitride (TiN), tantalum nitride (TaN), etc.), and may have any suitable thickness (e.g., ranging from about 5 nm to about 100 nm). The electrode 12 (as well as top electrodes 26, 26' discussed below and shown in FIG. 1D) may be a single layer having a single-component composition, a single layer with a multi-component composition, or a multi-layered structure with different materials in each of the layers.

The bottom electrode 12 may be fabricated using any suitable technique, such as photolithography, electron beam lithography, imprint lithography, thermal or e-beam evaporation, sputtering, atomic layer deposition (ALD), or the like. Although the bottom electrode 12 is shown with a rectangular cross-section, it is to be understood that the bottom electrode 12 may also have a circular, an elliptical, or another more complex cross-section. The bottom electrode 12 may also have many different widths or diameters and aspect ratios or eccentricities.

The oxygen-supplying layer 14 sandwiched between portions A, B of the insulating layer 16 form a material stack 15. To form the stack 15, the first portion A of the insulating layer 16 is deposited directly on the bottom electrode 12, the oxygen-supplying layer 14 is deposited directly on the portion A, and the second portion B of the insulating layer 16 is deposited directly on the oxygen-supplying layer 14. Each of the portions A, B, and the oxygen-supplying layer 14 may be initially deposited as planar films with respect to a contact surface 13 of the bottom electrode 12. In other words, surfaces of the respective layers 14 and 16 are substantially parallel to the contact surface 13 of the bottom electrode 12. By "substantially parallel," it is meant parallel±up to a 30° variance.

Suitable deposition techniques for the oxygen-supplying layer 14 and the portions A, B of the insulating layer 16 include conventional physical and chemical techniques, including evaporation from a heated source, such as a filament or a Knudsen cell, electron beam (i.e., e-beam) evaporation from a crucible, sputtering from a target, reactive sputtering, other forms of evaporation, chemical vapor deposition (CVD), molecular beam deposition, atomic layer deposition, pulse laser deposition, or various other forms of chemical vapor or beam growth from reactive precursors. Appropriate deposition or growth conditions, such as speed and temperature, may be selected to achieve the desirable chemical composition and local atomic structure desired for the layers 14, 16.

The oxygen-supplying layer 14 may also be further oxidized after deposition by exposing the layer 14 to plasma oxidation, thermal oxidation, or ion implantation of oxygen atoms.

Figure 1B:
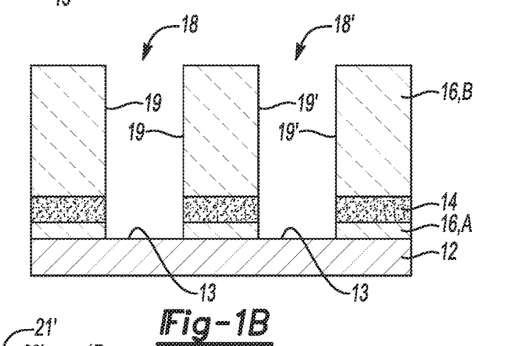

Suitable examples of the oxygen-supplying layer 14 include titanium dioxide ($TiO_2$), tantalum pentoxide ($Ta_2O_5$), nickel (II) oxide ($NiO_2$), zirconium oxide ($ZrO_2$), or hafnium (IV) oxide ($HfO_2$). It is to be understood that the composition of the oxygen-supplying layer 14 may depend upon the material(s) used to form the switching region(s) 24, 24' (shown in FIG. 1D). For example, it may be desirable that the oxygen-supplying layer 14 be formed of the same material that is used to form oxygen-rich film(s) (e.g., reference numeral 20, 20' in FIGS. 1C and 1D) of the switching region(s) 24, 24' (FIG. 1D).

Examples of suitable materials for the insulating layer 16 include silicon dioxide ($SiO_2$), silicon nitride ($Si_3N_4$), spin-on-glass, or aluminum oxide ($Al_2O_3$).

The respective thicknesses of each of the portions A, B of the insulating layer 16 and of the oxygen-supplying layer 14 may range anywhere from 2 nm to about 30 nm. The total thickness of the insulating layer 16 and of the oxygen-supplying layer 14 is equivalent to the thickness of the switching region(s) 24, 24' (FIG. 1D). Generally, the portion A should be thick enough to electrically insulate the bottom electrode 12 from the oxygen-supplying layer 14, and the oxygen-supplying layer 14 should be thick enough so that a sufficient quantity (volume) of oxygen is present.

For each switching region 24, 24' to be formed on the bottom electrode 12, a corresponding trench 18, 18' (i.e., hole, via, etc.) is formed in the layers 14, 16. FIG. 1B illustrates two trenches 18, 18'. It is to be understood that if a single two-terminal memristor were to be formed, a single trench 18 would be formed.

The trench(es) 18, 18' may be formed by patterning the portion B, the oxygen-supplying layer 14, and the portion A so that a hole having a desirable shape is formed therein. The desirable shape of the trench 18, 18' may be a cylinder, a rectangular prism, a cube, or another geometric shape having side walls 19, 19' that are substantially perpendicular to the contact surface 13 of the bottom electrode 12.

Figure 2:
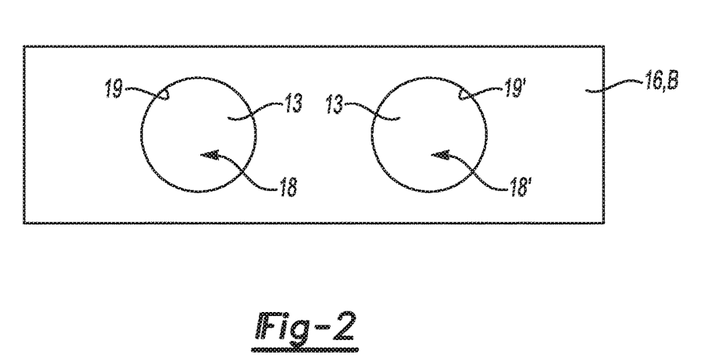
FIG. 2 is a top view of FIG. 1B.

A top view of FIG. 1B is shown in FIG. 2. As depicted, these example trenches 18, 18' have a cylindrical shape. As depicted in FIG. 2, the portion B of the insulating layer 16 surrounds each of the trench(es) 18, 18'. While not shown from the top view, it is to be understood that the entire material stack 15 (including the oxygen-supplying layer 14 and both portions A, B of the insulating layer 16) surround each of the trench(es). As such, the oxygen-supplying layer 14 can supply oxygen to or receive oxygen from the entire perimeter of the switching region 24, 24' that is in contact with the oxygen-supplying layer 14.

As shown in both FIG. 1B and FIG. 2, patterning is performed such that the portion B, the oxygen-supplying layer 14, and the portion A within the patterned area are removed so that the contact surface 13 of the bottom electrode 12 is exposed. As such, the bottom of each trench 18, 18' is the contact surface 13.

Several techniques may be used to pattern the trench(es) 18, 18', including anisotropic reactive ion etching, reactive ion etching, focused ion beam milling (FIB), laser ablation, or any other wet or dry chemical etching method. The bottom electrode 13 may act as an etch stop. In an example, anisotropic reactive ion etching may be particularly desirable because it allows for the selective removal of the portion B, the oxygen-supplying layer 14, and the portion A. It is to be understood that patterning may be performed with or without a mask, depending upon the technique used.

Figure 1C:
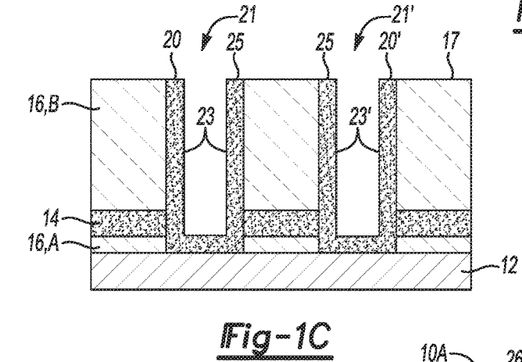
Figure 1D:
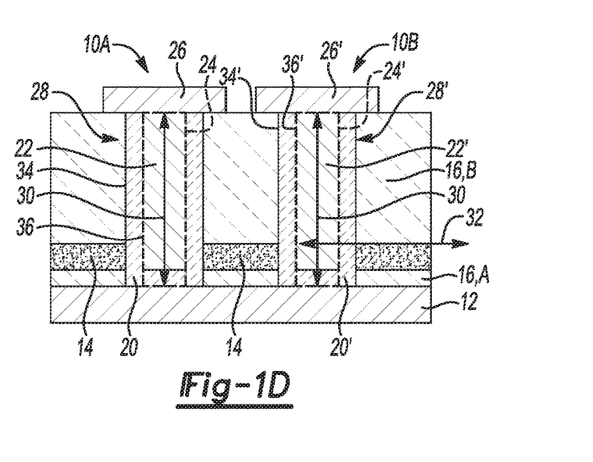

Referring now to FIG. 1C, the oxygen-rich film(s) 20, 20' is formed in each trench 18, 18'. The material used to form the oxygen-rich film 20, 20' depends upon the desired switching region 24, 24' that is to be formed. Suitable examples of the oxygen-rich film(s) 20, 20' include titanium dioxide ($TiO_2$), tantalum pentoxide ($Ta_2O_5$), nickel (II) oxide ($NiO_2$), zirconium oxide ($ZrO_2$), or hafnium (IV) oxide ($HfO_2$).

In the example shown in FIGS. 1A through 1D, it is desirable for the oxygen-rich film 20, 20' to conformally coat the side walls 19, 19' of the trench 18, 18' without completely filling the trench 18, 18'. This may be accomplished using conformal deposition.

When conformal deposition is used to form the oxygen-rich film 20, 20', oxygen-rich film material is conformally deposited. Conformal deposition may be accomplished by conformally growing the material in the trench(es) 18, 18' so that the resulting oxygen-rich film(s) 20, 20' is positioned within the trench(es) 18, 18' adjacent to the side wall(s) 19, 19 and to the exposed contact surface 13. Examples of conformal growth techniques include thermally activated chemical vapor deposition (CVD), plasma enhanced chemical vapor deposition (PECVD), and ALD.

In this example, the hole(s) 21, 21' automatically form by stopping conformal growth before the oxygen-film film 20, 20' completely fills the trench 18, 18'. If the hole(s) 21, 21' are too small after conformal deposition, anisotropic reactive ion etching (or some other suitable method) may be used to remove some of the oxygen-rich film(s) 20, 20'.

Referring now to FIG. 1D, the metal-rich film(s) 22, 22' is formed in each hole 21, 21'. The material used to form the metal-rich film(s) 22, 22' depends upon the desired switching region 24, 24' that is to be formed. The following table provides examples of suitable combinations of oxygen-rich film(s) 20, 20' and metal-rich film(s) 22, 22'.

| OXYGEN-RICH FILM/ METAL-RICH FILM COMBINATIONS | |
| --- | --- |
| oxygen-rich film material | metal-rich film material |
| titanium dioxide ($TiO_2$) | titanium (Ti) |
| tantalum pentoxide ($Ta_2O_5$) | tantalum (Ta) |
| nickel (II) oxide ($NiO_2$) | nickel (Ni) |
| zirconium oxide ($ZrO_2$) | zirconium (Zr) |
| hafnium (IV) oxide ($HfO_2$) | hafnium (Hf) |

In an example, the deposition of the metal-rich film material is performed selectively so that the metal-rich film material fills the hole 21, 21 and is planar with the surface 17 of the portion B of the insulating layer 16 and with the surface 25 of the oxygen-rich film(s) 20, 20'. In another example, the deposition is performed so that the metal-rich film material fills the hole 21, 21' and extends onto the surfaces 25 or 25 and 17. In these examples, chemical mechanical polishing (CMP) may be performed to remove excess metal-rich film material and to planarize the components (e.g., B, 20, 20', 22, 22').

Deposition of the metal-rich film material forms the metal-rich film(s) 22, 22' and the switching region(s) 24, 24' (discussed further below). It is to be understood that the metal-rich film 22, 22' provides part of the current path 30 through the switching region(s) 24, 24', and allows current to flow to all or some of the oxygen-rich film 20, 20' in contact therewith. Under certain electrical or thermal stresses, the metal-rich film 22, 22' also reacts with and reduces the oxygen-rich films 20, 20'. This reaction and reduction results in the formation of oxygen vacancies, such that a path (conductive channel) for electrical switching through the oxygen-rich films 20, 20' to the bottom electrode 12 is potentially enabled. This potential electrical switching path is located in the portions of films 20 and 20' that are in contact with the bottom electrode surface 13. As such, the switching region 24, 24' includes the metal-rich film 22, 22' and the portion of the oxygen-rich film 20, 20' in contact with both the metal-rich film 22, 22' and the bottom electrode surface 13. It is to be understood, however, that chemical interaction may occur over the entire interface between the oxygen-rich films 20, 20' and the metal-rich films 22, 22'.

While the current path 30 is shown by a single arrow, it is to be understood that current may flow through the entire switching region 24, 24' (after electroforming or thermal annealing is performed, as described below).

Once the metal-rich film(s) 22, 22' are formed, the method further includes forming top electrode(s) 26, 26' on portions of the material stack 15 and in respective electrical contact with the switching region(s) 24, 24'. The top electrode(s) 26, 26' is positioned at some non-zero angle with respect to the bottom electrode 12. This positioning prevents shorting of the resulting devices 10A, 10B.

The top electrode 26 is in contact with the metal-rich film 22 of the switching region 24. Similarly, in this example, the top electrode 26' is in contact with the metal-rich film 22' of the switching region 24'. As shown in FIG. 1D, the top electrodes 26, 26' may also contact the oxygen-rich films 20, 20. When multiple switching regions 24, 24' are formed on a single bottom electrode 12, it is to be understood that respective top electrodes 26, 26' are formed to be in electrical contact with a single one of the switching regions 24, 24' and to be electrically isolated from one another.

The top electrode(s) 26, 26' may be formed of any of the materials and by any of the techniques previously discussed for the bottom electrode 12.

With the addition of top electrode 26, 26, respective resistive memory devices 10A, 10B are formed. Each device 10A, 10B has a single junction 28, 28' (with a single switching region 24, 24') located at the intersection of the bottom electrode 12 and the respective top electrode 26, 26'. Each junction 28, 28' is individually addressable by the respective crossing electrodes 12 and 26 or 12 and 26'.

As illustrated in FIG. 1D, the resulting devices 10A, 10B have the oxygen-supplying layer 14 positioned orthogonally to the switching region(s) 24, 24' and to the current path 30 through the switching region 24, 24'. More particularly, the surface of the oxygen-supplying layer 14 (see arrow 32) is perpendicular to the surfaces 34, 34' and 36, 36' of the respective films 20, 20', and 22, 22', and to the surface of the switching region(s) 24, 24'.

Initially, when the device(s) 10A, 10B is/are first fabricated, the entire switching region 24, 24' may be nonconductive (due in part to the portion of the oxygen-rich film 20, 20' positioned between the bottom electrode 12 and the metal-rich film 22, 22'). As such, a forming process may be utilized to form the previously mentioned path/conductive channel(s) in the portion of the oxygen-rich film 20, 20' between the electrode 12 and the respective metal-rich films 22, 22'. Together, the metal-rich film 22, 22' and the path/conductive channels(s) within the oxygen-rich film 20, 20' form the current path 30.

An example of the forming process is electroforming, which includes applying a sufficiently high (threshold) voltage across the electrodes 12 and 26 or 12 and 26' for a sufficient length of time to produce a significant permanent change of electronic conductivity through the portion of the oxygen-rich film 20, 20' located between the electrode 12 and the metal-rich films 22, 22'. The threshold voltage and the length of time required for the forming process may depend upon the type of material used for the switching region 24, 24', the bottom electrode 12, and the top electrode(s) 26, 26', and the device geometry.

During the electroforming process, oxygen vacancies or ions are created in the oxygen-rich film 20, 20'. Under an electric field applied to the bottom electrode 12, these oxygen vacancies or ions drift toward the bottom electrode 12. This forms a localized path/conductive channel(s) of sub-oxide in the oxygen-rich film 20, 20'. The sub-oxide is a metal-rich, conductive filament. Examples of the sub-oxide that form include $TiO_{2-x}$, $Ta_2O_{5-x}$, $NiO_{2-x}$, $ZrO_{2-x}$, or $HfO_{2-x}$, depending upon the composition of the oxygen-rich film 20, 20'.

After electroforming, the device 10A, 10B may be switched at least between ON and OFF states. In the example shown in FIG. 1D, the oxygen-supplying layer 14 laterally supplies oxygen that oxidizes the path/conductive channel(s) of sub-oxide in the oxygen-rich film 20, 20' during OFF-switching (to a high-resistance state), while during ON-switching, the oxygen is laterally driven out of the conductive channel(s) into the oxygen-supplying layer 14.

Alternatively to electroforming, a thermal anneal may be performed during or after device 10A, 10B fabrication. The thermal annealing process may induce chemical reactions or diffusion of metal and oxygen atoms between the films 22, 22' and 20, 20' to the degree that the oxygen-rich films 20, 20' become metallic in composition, and thus electrically conducting, prior to any applied electrical stress. This is often referred to as an "initially ON state" device 10, which may be desirable because it does not require high forming voltages. In this case, the application of a negative pulse can switch the device to the OFF, or high resistance, state. In this example, the oxygen-supplying layer 14 also laterally supplies oxygen that oxidizes the metallic composition of the oxygen-rich film 20, 20' during OFF-switching (to a high-resistance state), while during ON-switching, the oxygen is laterally driven out of the oxygen-rich film 20, 20' into the oxygen-supplying layer 14.

Figure 3:
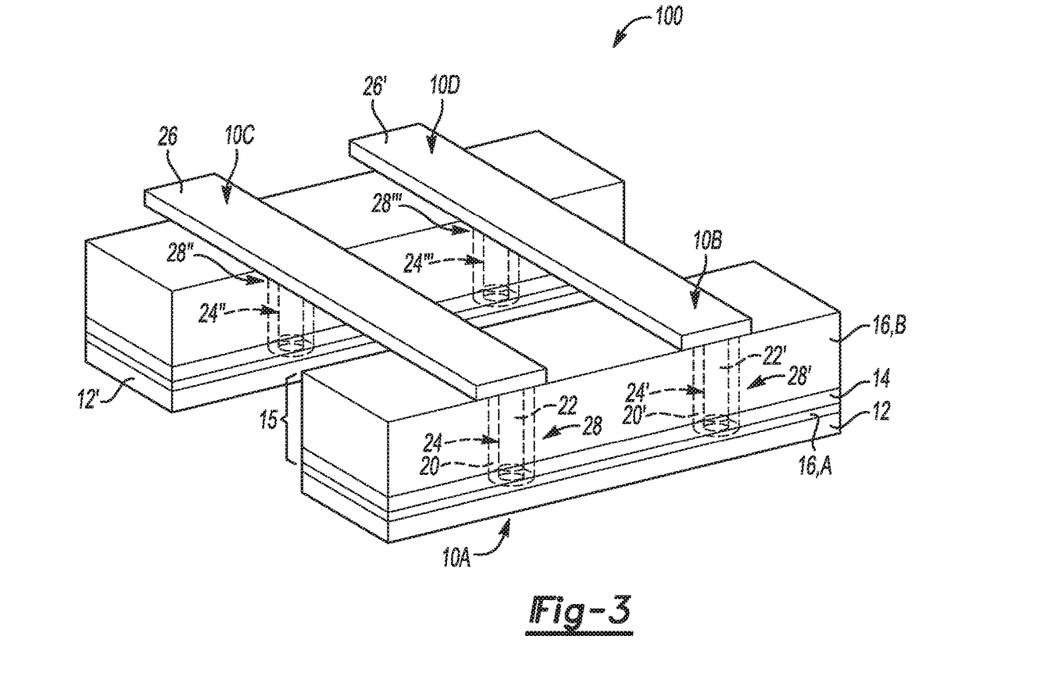
FIG. 3 is a perspective view of the example resistive memory device formed from the method shown in FIGS. 1A through 1D.

The devices 10A, 10B formed from the example shown in FIGS. 1A through 1D may be included in a crossbar 100, as shown in FIG. 3. Generally, the crossbar 100 is an array of switches wherein the electrodes 12, 12' in a set of parallel bottom electrodes cross the electrodes 26, 26' in a set of parallel top electrodes at non-zero angles. In many instances, the two sets of electrodes 12, 12' and 26, 26' are perpendicular to each other. However, this is not a necessary condition, and the two sets of electrodes 12, 12', 26, 26' may be offset at any non-zero angle.

In the crossbar 100, a device 10A, 10B, 10C, 10D is formed at the intersection of any two electrodes 12, 12' and 26, 26'. Each device 10A, 10B, 10C, 10D includes a respective junction 28, 28', 28", 28''' including a respective switching region 24, 24', 24", 24'''. The switching region 24, 24', 24", 24''' at each junction 28, 28', 28", 28''' is individually addressable after initial fabrication (including electroforming) by virtue of the respective electrodes 12, 26, or 12', 26, or 12, 26', or 12', 26' being in selective electrical contact with the switching region 24, 24, 24", 24'''. For example, if electrodes 12' and 26' are addressed with an appropriate voltage and polarity, device 10D is activated and switched to either the ON state or the OFF state, and if electrodes 12 and 26 are addressed with an appropriate voltage and polarity, device 10A is activated and switched to either the ON state or the OFF state. In the crossbar 100, it is to be understood that when one or more individual devices 10A, 10B, 10C, 10D is/are addressed, the switching region 24, 24', 24", 24''' positioned outside of the junction 28, 28', 28", 28''' that is being addressed may be under some bias that is insufficient to render a transition in the resistance state of that switching region 24, 24', 24" 24''' outside of the junction 28, 28', 28", 28'''.

Referring now to FIGS. 4A through 4D, another example of the method for forming another example of the resistive memory device 10' (FIG. 4D) is shown. In this example, a single two-terminal device is generated, but it is to be understood that multiple devices may be formed on a single bottom electrode 12, as long as the switching region and top electrode of each of the multiple devices are electrically isolated from the switching region and top electrode of each other device.

Figure 4A:
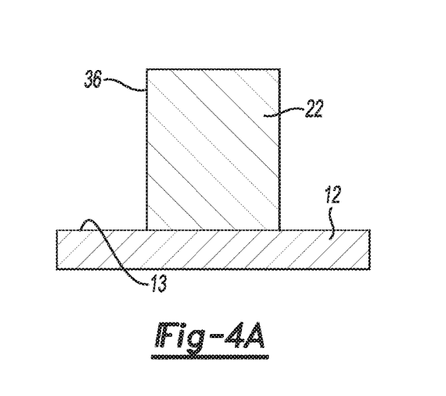
FIGS. 4A through 4D are cross-sectional views depicting another example of the method for making another example of the resistive memory device.

As shown in FIG. 4A, in this example of the method, the metal-rich film 22 is first formed directly on the bottom electrode 12. As such, the metal-rich film 22 is in electrical contact with the bottom electrode 12. It is to be understood that any of the materials and methods for forming the bottom electrode 12 described in reference to FIGS. 1A through 1D may be used in this example.

The metal-rich film 22 may be formed of any of the materials previously described. In this example, the metal-rich film 22 may be fabricated using any suitable technique, such as photolithography, electron beam lithography, imprint lithography, thermal or e-beam evaporation, sputtering, atomic layer deposition (ALD), or the like.

In the example shown in FIG. 4A, the metal-rich film 22 has a pillar-like geometry that protrudes outward from the contact surface 13 of the bottom electrode 12. The pillar-like geometry has a surface (side walls) 36 that is substantially perpendicular to the contact surface 13. The pillar-like geometry may be a cylinder, a rectangular prism, a cube, or another geometric shape having the surface 36 that is substantially perpendicular to the contact surface 13 of the bottom electrode 12.

Figure 4B:
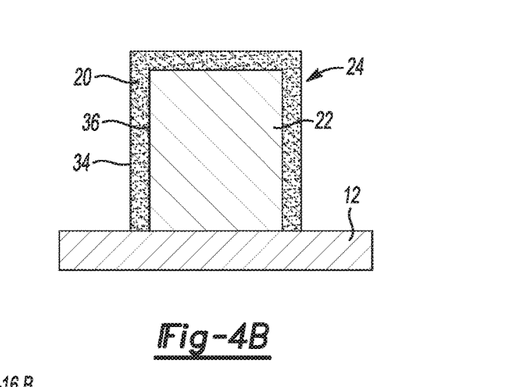

In FIG. 4B, the oxygen-rich film 20 is deposited on the exposed surfaces of the metal-rich film 22. It is to be understood that any of the materials and methods for forming the oxygen-rich film 20 described in reference to FIGS. 1A through 1D may be used in this example. In an example, conformal growth techniques may be used so that additional patterning step(s) are not required.

Together, the metal-rich film 22 and the portion of the oxygen-rich film 20 between the metal-rich film 22 and a subsequently formed top electrode 26 form the switching region 24.

Figure 4C:
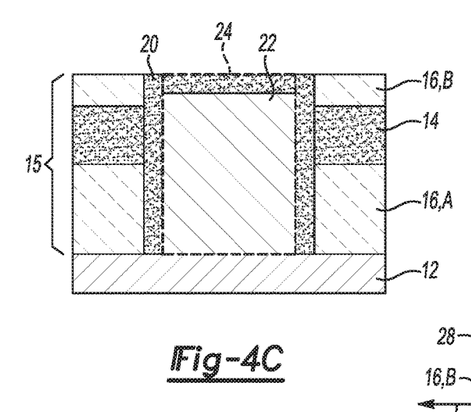

As shown in FIG. 4C, after the oxygen-rich film 20 is formed, the material stack 15, including the oxygen-supplying layer 14 sandwiched by the portions A, B of the insulating layer 16, is formed to surround the oxygen-rich film 20 (and thus the switching region 24). The oxygen-supplying layer 14 and the insulating layer 16 may be formed of any of the materials previously described.

In this example, a mask may be used in combination with a suitable deposition technique, some of which are described herein in reference to FIG. 1A. When used, the mask protects the top surface of the oxygen-rich film 20, but allows the first portion A of the insulating layer 16 to be directly deposited on the exposed portions of the contact surface 13, the oxygen-supplying layer 14 to be directly deposited on the portion A, and the second portion B of the insulating layer 16 to be directly deposited on the oxygen-supplying layer 14. If a conformal growth process is used to form the stack 15, the mask may not be used.

In this example, it is believed that oxygen-supplying layer 14 may be formed using a directional deposition technique, such as e-beam evaporation or another like process. Once deposited, the layer 14 may be further oxidized using plasma oxidation, thermal oxidation, or ion implantation of oxygen atoms.

Each layer 14, 16 of the stack 15 surrounds and is in contact with the oxygen-rich film 20. As such, the oxygen-supplying layer 14 can supply oxygen to or receive oxygen from the entire perimeter of the switching region 24, 24 that is in contact with the oxygen-supplying layer 14.

Figure 4D:
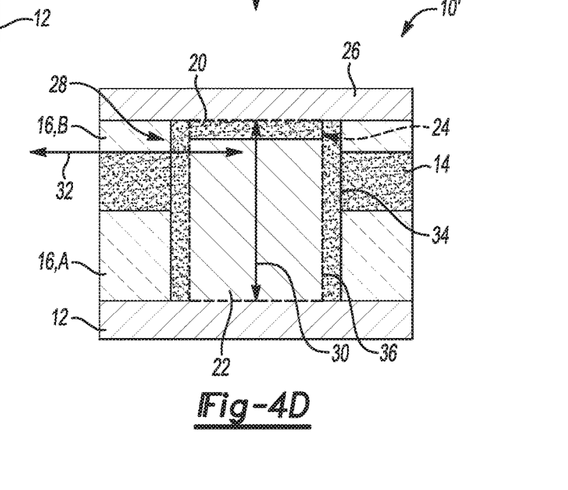

As shown in FIG. 4C, the oxygen-rich film 20 forms a planar surface with the portion B of the insulating layer 16. Upon this planar surface, the top electrode 26 is formed so that it is at least in contact with the oxygen-rich film 20. The top electrode 26 is shown in FIG. 4D. It is to be understood that any of the materials and methods for forming the top electrode 26 described in reference to FIGS. 1A through 1D may be used in this example. While not shown in the cross-section of FIG. 4D, it is to be understood that the top electrode 26 is fabricated to cross the bottom electrode 12 at some non-zero angle.

With the addition of the top electrode 26, the resistive memory device 10' is formed. This device 10' has a single junction 28 (with a single switching region 24) located at the intersection of the bottom electrode 12 and the top electrode 26. As such, the junction 28 is individually addressable.

As illustrated in FIG. 4D, the resulting device 10' has the oxygen-supplying layer 14 positioned orthogonally to the switching region 24 and to the current path 30 through the switching region 24. More particularly, the surface of the oxygen-supplying layer 14 (see arrow 32) is substantially perpendicular to the surfaces 34 and 36 of the respective films 20 and 22 of the switching region(s) 24.

Similar to the device(s) 10A, 10B, when the device 10' is initially fabricated, the entire switching region 24 may be nonconductive (due in part to the portion of the oxygen-rich film 20 positioned between the top electrode 26 and the metal-rich film 22). As such, electroforming may be utilized to form the path/conductive channel(s) in the oxygen-rich film 20 between the respective electrodes 12 and 26 or 12 and 26' or thermal annealing may be used to render the oxygen-rich film 20 metallic in composition.

The device 10' may be switched at least between ON and OFF states. In the example shown in FIG. 4D, the oxygen-supplying layer 14 laterally supplies oxygen that oxidizes the path/conductive channel(s) of sub-oxide in the oxygen-rich film 20 or oxidizes the metallic composition of the oxygen-rich film 20, 20' during OFF-switching (to a high-resistance state), while during ON-switching, the oxygen is laterally driven out of the oxygen-rich film 20, 20' into the oxygen-supplying layer 14.

The device 10' formed from the example shown in FIGS. 4A through 4D may be included in a crossbar (not shown), similar to the crossbar 100 shown in FIG. 3.

Figure 5A:
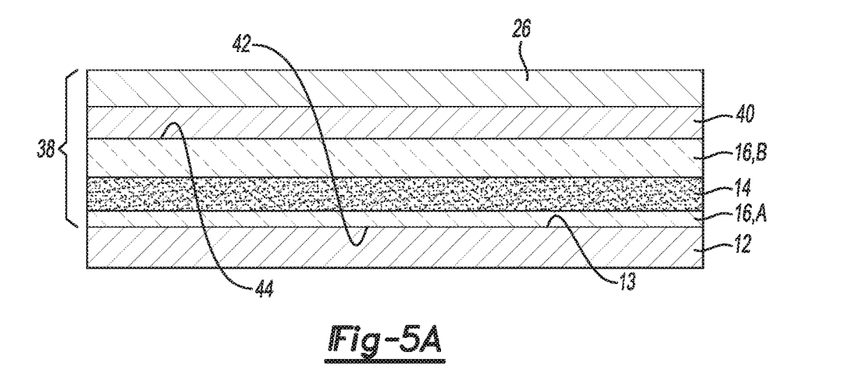
FIGS. 5A through 5C are cross-sectional views depicting yet another example of the method for making yet another example of the resistive memory device.
Figure 5B:
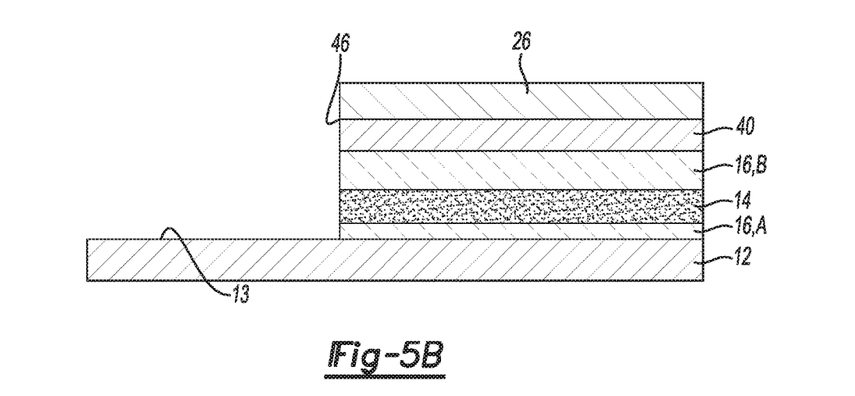
Figure 5C:
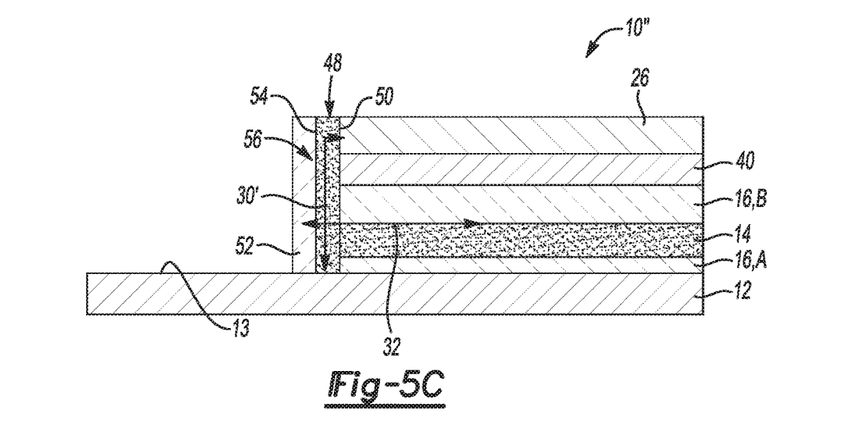

Referring now to FIGS. 5A through 5C, still another example of the method for making another example of the resistive memory device 10" (see FIG. 5C) is schematically depicted. As shown in FIG. 5A, at the outset of this method, a stack 38 of planar layers is formed on the bottom electrode 12. It is to be understood that any of the materials and methods for forming the bottom electrode 12 described in reference to FIGS. 1A through 1D may be used in this example.

The stack 38 includes the oxygen-supplying layer 14 sandwiched between portions A, B of the insulating layer 16, a metal layer 40, and a top electrode 26. The portions A, B of the insulating layer 16 have opposed surfaces 42, 44, one 42 of which contacts the bottom electrode 12, and the other 44 of which contacts the metal layer 40.

To form the stack 38, the first portion A of the insulating layer 16 is deposited directly on the bottom electrode 12, the oxygen-supplying layer 14 is deposited directly on the portion A, the second portion B of the insulating layer 16 is deposited directly on the oxygen-supplying layer 14, the metal layer 40 is deposited directly on the portion B, and the top electrode 26 is deposited or positioned on the metal layer 40.

The layers 14, 16, and 40 of the stack 38 may be deposited as planar films with respect to a contact surface 13 of the bottom electrode 12. In other words, surfaces of the respective layers 14, 16, and 40 are substantially parallel to the contact surface 13 of the bottom electrode 12. Suitable deposition techniques for the layers 14, 16, and 40 include conventional physical and chemical techniques, including evaporation from a heated source, such as a filament or a Knudsen cell, electron beam (i.e., e-beam) evaporation from a crucible, sputtering from a target, reactive sputtering, other forms of evaporation, chemical vapor deposition (CVD), PECVD, molecular beam deposition, atomic layer deposition, pulse laser deposition, or various other forms of chemical vapor or beam growth from reactive precursors. Appropriate deposition or growth conditions, such as speed and temperature, may be selected to achieve the desirable chemical composition and local atomic structure desired for the layers 14, 16.

The oxygen-supplying layer 14 and the insulating layer 16 may be formed of any of the materials previously described.

The oxygen-supplying layer 14 may also be further oxidized after deposition by exposing the layer 14 to plasma oxidation, thermal oxidation, or ion implantation of oxygen atoms.

The metal used to form the metal layer 40 depends upon the desired switching region 48 (see FIG. 5C) that is to be formed. In an example, the metal layer 40 is formed of the same metal that is used to form the metal oxide layer that makes up switching region 48. Examples of the metal oxide/metal combinations for the switching region 48/metal layer 40 include titanium dioxide ($TiO_2$)/titanium (Ti), tantalum pentoxide ($Ta_2O_5$)/tantalum (Ta), nickel (H) oxide ($NiO_2$)/nickel (Ni), zirconium oxide ($ZrO_2$)/zirconium (Zr), and hafnium (IV) oxide ($HfO_2$)/hafnium (Hf).

The top electrode 26 may be formed of any of the materials and by any of the techniques previously discussed for the bottom electrode 12. While not shown in the cross-sectional view of FIG. 5A, it is to be understood that the top electrode 26 may be positioned such that is crosses the bottom electrode 12 at a non-zero angle (see, e.g., FIG. 6).

As shown in FIG. 5B, this example of the method further includes patterning the stack 38 to expose a portion of the contact surface 13 of the bottom electrode 12. Patterning also exposes an edge 46 of the stack, and thus respective edges of each layer 14, 16 (A and B), 40, and 26 of the stack 38. The edge 46 is substantially perpendicular to the surface of the oxygen-supplying layer 14 (see arrow 32).

FIGS. 5A and 5B illustrate the formation of a single stack 38 and a single edge 46. When multiple switching regions 48 are to be formed on a single bottom electrode 12, the single stack 38 may still be formed, but patterning may be performed so that the single stack 38 is divided into sub-stacks that are physically separated from one another on the contact surface 13. Each of these sub-stacks has an exposed edge 46, 46' (see FIG. 6).

Patterning of the stack 38 may be performed by anisotropic reactive ion etching, reactive ion etching, focused ion beam milling (FIB), laser ablation, or any other wet or dry chemical etching method. The bottom electrode 13 may act as an etch stop. In an example, anisotropic reactive ion etching may be particularly desirable because it allows for the selective removal of the layers 14, 16 (A and B), 40, and 26 of the stack 38. It is to be understood that patterning may be performed with or without a mask, depending upon the technique used and/or the number of sub-stacks to be formed.

The switching region 48 is then formed along the edge 46, as shown in FIG. 5C. In this example, a metal oxide material is selectively deposited on the contact surface 13 adjacent to the edge 46. Any suitable selective deposition process described herein may be used (e.g., masking and depositing, conformal growth, etc.) The selective deposition is performed so that a surface 50 of the metal oxide material contacts the edge 46, and thus contacts each of the portions A, B of insulating layer 16, the oxygen-supplying layer 14, the metal layer 40, and the top electrode 26. The selectively deposited metal oxide material electrically contacts both the bottom electrode 12 and the top electrode 26, and thus forms the switching region 48 for this example of the device 10".

With the addition of the switching region 48, the resistive memory device 10" is formed. In this example of the device 10", a single junction 56 (with a single switching region 48) is located at the edge of the intersection of the bottom electrode 12 and the top electrode 26. The junction 56 is individually addressable by the crossing electrodes 12 and 26.

Furthermore, the resulting device 10" has the oxygen-supplying layer 14 positioned orthogonally to the switching region 48 and to the current path 30' through the switching region 48.

Initially, when the device 10" is first fabricated, the entire switching region 48 may be nonconductive. As such, a forming process may be utilized to form conductive channel(s) in the switching region 48 connecting the electrodes 12 and 26. The conductive channels(s) within the switching region 48 form the current path 30'. While the current path 30 is shown by a single arrow, it is to be understood that current may flow through the entire switching region 48 (after electroforming is performed as described herein).

An example of the forming process is electroforming, which includes applying a sufficiently high (threshold) voltage across the electrodes 12 and 26 for a sufficient length of time to produce a significant permanent change of electronic conductivity through the switching region 48. The threshold voltage and the length of time required for the forming process may depend upon the type of material used for the switching region 48, the bottom electrode 12, and the top electrode 26, and the device geometry.

During the electroforming process, oxygen vacancies or ions are created in the metal oxide material making up the switching region 48. Under an electric field applied to the bottom electrode 12, these oxygen vacancies or ions form a path/conductive channel(s) between the top electrode 26 and the bottom electrode 12. The path/conductive channel(s) is a sub-oxide, which is a metal-rich, conductive filament. Examples of the sub-oxide that form include $TiO_{2-x}$, $Ta_2O_{5-x}$, $NiO_{2-x}$, $ZrO_{2-x}$, or $HfO_{2-x}$, depending upon the metal oxide material that is used.

After electroforming, a capping layer 52 may be selectively deposited along the surface 54 of the switching region 48. This capping layer 52 may be any suitable oxide material that can serve as an additional oxygen source/sink for the switching region 48.

Also after electroforming, the device 10" may be switched at least between ON and OFF states. In the example shown in FIG. 5C, the oxygen-supplying layer 14 laterally supplies oxygen that oxidizes the conductive channel(s) of sub-oxide in the switching region 48 during OFF-switching (to a high-resistance state), while during ON-switching, the oxygen is laterally driven out of the conductive channel(s) into the oxygen-supplying layer 14.

Alternately, the switching region 48 may be deposited so as to be initially conducting, or in the ON state. This may be accomplished using thermal annealing during the deposition of the switching region material. In this example, the application of a negative pulse can switch the device 10" to the OFF, or high resistance, state. Thereafter, the device 10" can be cycled between ON and OFF states by alternately polarized pulses.

Figure 6:
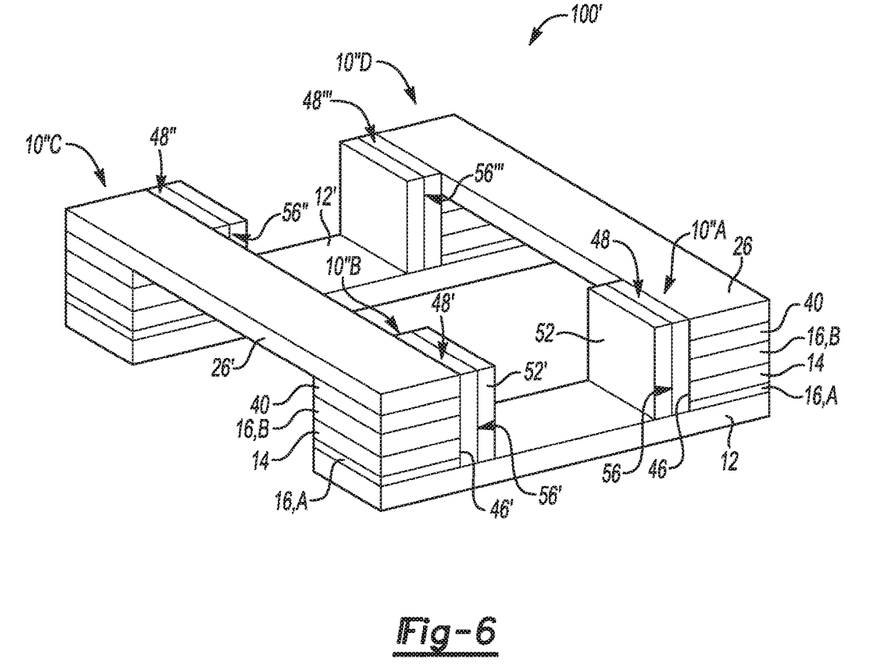
FIG. 6 is a perspective view of the resistive memory device formed from the method shown in FIGS. 5A through 5C.

The device 10" formed from the example shown in FIGS. 5A through 5C may be included in a crossbar 100', as shown in FIG. 6. Similar to the crossbar 100, the crossbar 100' is an array of switches wherein the electrodes 12, 12' in a set of parallel bottom electrodes cross the electrodes 26, 26' in a set of parallel top electrodes at non-zero angles. In many instances, the two sets of electrodes 12, 12' and 26, 26' are perpendicular to each other. However, this is not a necessary condition, and the two sets of electrodes 12, 12', 26, 26' may be offset at any non-zero angle.

In the crossbar 100', a device 10"A, 10"B, 10"C, 10"D is formed at the intersection of any two electrodes 12, 12' and 26, 26'. Each device 10"A, 10"B, 10"C, 10"D includes a respective junction 56, 56', 56", 56''' including a respective switching region 48, 48', 48", 48'''. The switching region 48, 48', 48", 48''' at each junction 56, 56', 56", 56''' is individually addressable after initial fabrication (including electroforming) by virtue of the respective electrodes 12, 26, or 12', 26, or 12, 26', or 12', 26' being in selective electrical contact with the switching region 48, 48', 48", 48'''. For example, if electrodes 12' and 26' are addressed with an appropriate voltage and polarity, device 10"C is activated and switched to either the ON state or the OFF state, and if electrodes 12 and 26 are addressed with an appropriate voltage and polarity, device 10"A is activated and switched to either the ON state or the OFF state. In the crossbar 100', it is to be understood that when one or more individual devices 10"A, 10"B, 10"C, 10"D is/are addressed, the switching region 48, 48', 48", 48''' positioned outside of the junction 56, 56', 56", 56''' that is being addressed may be under some bias that is insufficient to render a transition in the resistance state of that switching region 48, 48', 48", 48''' outside of the junction 56, 56', 56", 56'''.

While not shown in the examples disclosed herein, it is to be understood that the devices 10A, 10B, 10', 10" (whether in the form of a single two-terminal memristor or a crossbar 100, 100') may be supported on an insulating layer. The insulating layer may be used alone, or in combination with another substrate. An example of a suitable insulating layer is silicon dioxide ($SiO_2$), and an example of a suitable substrate is a silicon (Si) wafer. As an example, the devices 10A, 10B, 10', 10" may be fabricated directly on the insulating layer supported by the substrate. For example, the bottom electrode 12 may be formed and patterned on the insulating layer, and then the other device components may be fabricated thereon in accordance with any of the methods described herein.

It is to be understood that the components of the examples disclosed herein may be positioned in a number of different orientations, and any directional terminology used in relation to the orientation of the components is used for purposes of illustration and is in no way limiting, unless specified otherwise. Directional terminology includes words such as "top," "bottom," etc.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range from about 2 nm to about 30 nm should be interpreted to include not only the explicitly recited limits of about 2 nm to about 30 nm, but also to include individual values, such as 3.4 nm, 12 nm, 27 nm, etc., and sub-ranges, such as from about 5 nm to about 10 nm, from about 11 nm to about 20 nm, etc. Furthermore, when "about" is utilized to describe a value, this is meant to encompass minor variations (up to +/−10%) from the stated value.

In describing and claiming the examples disclosed herein, the singular forms "a", "an", and "the" include plural referents unless the context clearly dictates otherwise.

While several examples have been described in detail, it will be apparent to those skilled in the art that the disclosed examples may be modified. Therefore, the foregoing description is to be considered non-limiting.

What is claimed is:

1. A resistive memory device, comprising:
a bottom electrode;
a top electrode crossing the bottom electrode at a non-zero angle;
a switching region operatively contacting the bottom electrode and the top electrode, the switching region defining a current path between the bottom electrode and the top electrode in an ON state; and
an oxygen-supplying layer operatively contacting a portion of the switching region, the oxygen-supplying layer being positioned orthogonally to the current path and to the switching region.

2. The resistive memory device as defined in claim 1, further comprising an insulating layer sandwiching the oxygen-supplying layer to form a stack between the bottom electrode and the top electrode, the stack surrounding at least a portion of the switching region.

3. The resistive memory device as defined in claim 2 wherein the switching region includes:
an oxygen-rich film in contact with the stack, the top electrode, and the bottom electrode; and
a metal-rich film in contact with the oxygen-rich film and the top electrode.

4. The resistive memory device as defined in claim 2 wherein the switching region includes:
an oxygen-rich film in contact with the stack, the top electrode, and the bottom electrode; and
a metal-rich film in contact with the oxygen-rich film and the bottom electrode.

5. The resistive memory device as defined in claim 1 wherein:
the top electrode is part of a stack that further includes:
an insulating layer sandwiching the oxygen-supplying layer and having two opposed surfaces; and
a metal layer positioned between one of the two opposed surfaces of the insulating layer and the top electrode;
wherein another of the two opposed surfaces of the insulating layer contacts the bottom electrode; and
the switching region is positioned on the bottom electrode and has a surface that contacts an edge of the stack such that the switching region contacts an edge of each of the top electrode, the insulating layer, the oxygen-supplying layer, and the metal layer.

6. The resistive memory device as defined in claim 5 wherein the switching region is a metal oxide.

7. The resistive memory device as defined in claim 5, further comprising a capping layer contacting another surface of the switching region.

8. The resistive memory device as defined in claim 1, further comprising:
a second top electrode electrically isolated from the first top electrode and crossing the bottom electrode at a non-zero angle; and
a second switching region electrically isolated from the switching region and operatively contacting the bottom electrode and the second top electrode, the second switching region defining another current path between the bottom electrode and the second top electrode in an ON state;
wherein the oxygen-supplying layer operatively contacts a portion of the second switching region, and wherein the oxygen-supplying layer is positioned orthogonally to the other current path and to the second switching region.

9. A crossbar, comprising:
an array of parallel bottom electrodes;
an array of parallel top electrodes crossing the bottom electrodes at a non-zero angle;
a junction formed at each intersection of one of the bottom electrodes and one of the top electrodes;
a switching region at each junction, the switching region defining a current path between the one of the bottom electrodes and the one of the top electrodes in an ON state; and
an oxygen-supplying layer operatively contacting a portion of each switching region, the oxygen-supplying layer being positioned orthogonally to the current paths and to the switching regions.

10. A method for making a resistive memory device, the method comprising:
forming a bottom electrode;
forming an oxygen-supplying layer on the bottom electrode;
forming an insulating layer on the oxygen-supplying layer, wherein the oxygen-supplying layer is sandwiched between the insulating layer and the bottom electrode, the oxygen-supplying layer being substantially parallel to a contact surface of the bottom electrode;
forming a switching region such that the switching region operatively contacts the contact surface of the bottom electrode, and is orthogonal to the contact surface of the bottom electrode; and
forming a top electrode such that is crosses the bottom electrode at a non-zero angle and operatively contacts the switching region.

11. The method as defined in claim 10 wherein:
forming the oxygen-supplying layer sandwiched between the insulating layer includes:
depositing a portion of the insulating layer on the contact surface of the bottom electrode;
depositing the oxygen-supplying layer on the portion of the insulating layer; and
depositing another portion of the insulating layer on the oxygen-supplying layer;
forming the switching region includes:
forming a trench in the oxygen-supplying layer sandwiched between the insulating layer such that a portion of the contact surface of the bottom electrode is exposed;
conformally depositing an oxygen-rich film on exposed surfaces of the trench; and
selectively depositing a metal-rich film to fill the trench; and
the top electrode contacts the metal-rich film of the switching region.

12. The method as defined in claim 10, further comprising exposing the switching region to electroforming or thermal annealing.

13. The method as defined in claim 10 wherein:
forming the switching region includes:
selectively depositing a metal-rich film on a portion of the contact surface of the bottom electrode such that the metal-rich film protrudes out from the contact surface; and
conformally depositing an oxygen-rich film on exposed surfaces of the metal-rich film;
forming the oxygen-supplying layer sandwiched between the insulating layer includes:

selectively depositing a portion of the insulating layer on the contact surface of the bottom electrode such that the portion surrounds the oxygen-rich film of the switching region;
directionally depositing the oxygen-supplying layer on the portion of the insulating layer; and
selectively depositing an other portion of the insulating layer on the oxygen-supplying layer; and
the top electrode contacts the oxygen-rich film of the switching region.

14. The method as defined in claim 10 wherein:
forming the oxygen-supplying layer sandwiched between the insulating layer includes:
depositing a portion of the insulating layer on the contact surface of the bottom electrode;
depositing the oxygen-supplying layer on the portion of the insulating layer; and
depositing another portion of the insulating layer on the oxygen-supplying layer;
the method further comprises forming a metal layer on the other portion of the insulating layer; and
the top electrode is formed on the metal layer.

15. The method as defined in claim 14 wherein:
the portion of the insulating layer, the oxygen-supplying layer, the other portion of the insulating layer, the metal layer, and the top electrode form a stack;
the method further comprises patterning the stack to expose a portion of the contact surface, and to expose an edge of each of the portion of the insulating layer, the oxygen-supplying layer, the other portion of the insulating layer, the metal layer, and the top electrode; and
forming the switching region includes selectively depositing a metal oxide on the exposed portion of the contact surface and along the edges of each of the portion of the insulating layer, the oxygen-supplying layer, the other portion of the insulating layer, the metal layer, and the top electrode.

\* \* \* \* \*